(12) United States Patent
Treibergs et al.

(10) Patent No.: US 7,173,442 B2
(45) Date of Patent: Feb. 6, 2007

(54) INTEGRATED PRINTED CIRCUIT BOARD AND TEST CONTACTOR FOR HIGH SPEED SEMICONDUCTOR TESTING

(75) Inventors: Valts Treibergs, White Bear Township, MN (US); Jason Mroczkowski, Hudson, WI (US)

(73) Assignee: Delaware Capital Formation, Inc., Wilmington, DE (US)

( * ) Notice: Subject to any disclaimer, the term of this patent is extended or adjusted under 35 U.S.C. 154(b) by 97 days.

(21) Appl. No.: 10/912,331

(22) Filed: Aug. 5, 2004

(65) Prior Publication Data
US 2005/0046433 A1 Mar. 3, 2005

Related U.S. Application Data

(60) Provisional application No. 60/497,581, filed on Aug. 25, 2003.

(51) Int. Cl.
 *G01R 1/073* (2006.01)
(52) U.S. Cl. .................................. 324/762; 324/754
(58) Field of Classification Search ...................... None
 See application file for complete search history.

(56) References Cited

U.S. PATENT DOCUMENTS

| 4,597,617 | A | * | 7/1986 | Enochs ........................ 439/66 |
| 4,697,143 | A | * | 9/1987 | Lockwood et al. .......... 324/754 |
| 4,829,242 | A | * | 5/1989 | Carey et al. ................. 324/754 |
| 4,894,612 | A | * | 1/1990 | Drake et al. ................ 324/754 |
| 4,912,399 | A | * | 3/1990 | Greub et al. ................ 324/754 |
| 5,012,187 | A | * | 4/1991 | Littlebury ................... 324/754 |
| 5,038,100 | A | | 8/1991 | Kushner et al. |
| 5,069,629 | A | | 12/1991 | Johnson |
| 5,123,850 | A | | 6/1992 | Elder et al. |
| 5,207,584 | A | | 5/1993 | Johnson |
| 5,268,636 | A | * | 12/1993 | Phillips et al. ........... 324/158.1 |
| 5,330,919 | A | | 7/1994 | Westbrook et al. |

(Continued)

FOREIGN PATENT DOCUMENTS

DE 44 17 586 A1 2/1995

(Continued)

OTHER PUBLICATIONS

Leslie, Brian et al, Hewlett Packard Co., Circuity Technology R&D Laboratories, P.O. Box 10490, Palo Alto, CA 94303, Membrane Probe Card Technology (The Future For High Performance Wafer Test), 1988 (Month Unavailable), IEEE 1988 International Test Conference, Paper 30.1, pp. 601-607.*

(Continued)

*Primary Examiner*—Ernest Karlsen
(74) *Attorney, Agent, or Firm*—Christie, Parker & Hale, LLP.

(57) ABSTRACT

An integrated printed circuit board and test contactor for high speed semiconductor testing having an alignment housing with a cavity for receipt and positioning of the integrated circuit to be tested, a printed circuit board having a non-conductive elastomer portion positioned along a surface of the printed circuit board and an electrically balanced microwave transmission line structure having flexible fingers for transmitting test signals from the integrated circuit through the printed circuit board. A U-shaped ground element extends around the microwave transmission line structure.

7 Claims, 6 Drawing Sheets

U.S. PATENT DOCUMENTS

| | | | |
|---|---|---|---|
| 5,360,348 A | | 11/1994 | Johnson |
| 5,426,405 A | | 6/1995 | Miller et al. |
| 5,561,378 A | * | 10/1996 | Bockelman et al. ........ 324/754 |
| 5,688,128 A | | 11/1997 | Ikeya |
| 5,914,613 A | * | 6/1999 | Gleason et al. ............. 324/754 |
| 6,025,731 A | * | 2/2000 | Hembree et al. ........... 324/758 |
| 6,064,218 A | | 5/2000 | Godfrey et al. |
| 6,437,584 B1 | | 8/2002 | Gleason et al. |
| 6,815,963 B2 | * | 11/2004 | Gleason et al. ............. 324/754 |
| 6,838,890 B2 | * | 1/2005 | Tervo et al. ................. 324/754 |
| 7,057,404 B2 | * | 6/2006 | Gleason et al. ............. 324/754 |

FOREIGN PATENT DOCUMENTS

| | | | |
|---|---|---|---|
| JP | 2005070050 A | * | 3/2005 |
| WO | WO 00/04394 A | | 1/2000 |

OTHER PUBLICATIONS

Berg, W. E. "Multi-GHz Elastomeric Connectors for Complex Hybrids and Chip Carriers." IEEE, May 22, 1989, pp. 50-70.

Communication from the EPO dated Dec. 12, 2004 enclosing 1) European Search Report, Application No. 04 25 5058, Search Completed on Nov. 23, 2004, Berlin; and 2) Abstract (4 pages).

Communication from the Austrian Patent Office Service and Information Center (TRF) dated Mar. 18, 2005; Search Report, completed on Mar. 3, 2005, Austria.

* cited by examiner

INTEGRATED PRINTED CIRCUIT BOARD AND TEST CONTACTOR FOR HIGH SPEED SEMICONDUCTOR TESTING

CROSS-REFERENCE TO RELATED APPLICATION(S)

This application claims the benefit of the filing date of U.S. Provisional Patent Application Ser. No. 60/497,581 filed Aug. 25, 2003, the entire content of which is hereby expressly incorporated by reference.

BACKGROUND OF THE INVENTION

The present invention relates to an integrated circuit test interface system, and more specifically to a test apparatus having a socket guide plate that aligns the integrated circuit being tested to conductive flexible elements integrated into a laminated printed circuit board.

In the past, contactors have been used to electrically connect the individual leads of a semiconductor package with a test apparatus to electrically test the component. Some semiconductor packages are peripherally leaded which have leads joining the package body around the outside edge of the package. Peripherally leaded packages include quad-flat, small outline, plastic leaded chip carrier, dual in-line and molded carrier rings among others. Peripherally leaded packages come in various dimensions and leads may be positioned around all four sides of the package or around less than all sides.

Previous apparatuses used to make electrical test connection to peripherally leaded packages and other types of semiconductor packages have severe limitations for high performance devices as well as reliability issues for operation when used with high volume, automated device handling equipment. Many of the problems result in poor electrical performance. Typically, this is due to long electrical path lengths within the contactor. Long electrical path lengths exhibit undesirable impedance effects which interfere with the integrity of the electrical tests being performed on the device under test. Undesirable impedance effects include long paths of uncontrolled impedance. Such uncontrolled impedance paths distort high frequency signal integrity and allow cross-talk between physically adjacent paths. Other undesirable impedance effects include parasitic inductance, capacitance, and resistance. Parasitic path inductance interferes with device power and ground sourcing by inducing voltage spikes during instantaneous electrical current changes. Parasitic capacitance presents undesirable electrical loading of the device and test electronic signal sources. Parasitic resistance causes voltage errors when significant current must flow through the resistive path. This is only a partial list of undesirable impedance effects which occur with long electrical paths in test contactors.

Previous test contactors often performed poorly in high volume test environments which employ automated device handling equipment. Contactor fragility often results in contactor damage when a handling equipment error presents a device to a contactor incorrectly. Contactors often wear rapidly during high volume use resulting in wear damage to alignment features and contact surfaces. Contactors may also be too susceptible to contamination from normal production environment debris such as package resin dust and package lead solder-plating.

Consequently there is a need for a contactor that is quick and simple to manufacture and eliminates electrical performance problems of undesirable impedance effects.

SUMMARY OF THE INVENTION

The present invention is a test contactor for high speed semiconductor testing which eliminates the problems associated with previous test contactor devices. The invention is a complete integrated circuit test interface system that is comprised of a socket guide plate that aligns the semiconductor package to conductive flexible elements integrated into a laminated printed circuit board. The contactor is constructed such that the geometry of the elements form an electrically balanced microwave transmission line structure from the printed circuit board periphery beyond the outer periphery of the integrated circuit to the integrated circuit pads. The transmission line structure is based on a coplanar waveguide geometry that is compressed onto a printed circuit board pad by a non-conductive tie-bar, which is compressed to the printed circuit board with the alignment housing. The coplanar waveguide geometry structure then extends over a shallow depression built into the printed circuit board. The shallow depression is filled with a non-conductive elastomer that acts as a force compression mechanism and a dielectric medium for the coplanar waveguide geometry transmission line. The flexible elements terminate below the test sites on the integrated circuit. The flexible elements include an elevated contact location designed to engage the integrated circuit test site, which could be a pad or a ball. A U-shaped ground beam extends around the signal pins of the flexible contact elements. The contactor materials are designed to match the proper impedance of the system, and in material transition zones, the transmission line has been compensated for optimum signal integrity.

The integrated circuit to be tested is inserted into the housing that aligns the contactor laterally into position. The integrated circuit is then pressed into the elevated contact features on the flexible elements which are then driven down into the elastomer in the printed circuit board depression. The compression of the elastomer results in an adequate force to make good electrical contact between the flexible elements and the test locations on the integrated circuit.

DETAILED DESCRIPTION OF THE INVENTION

Figure 1:
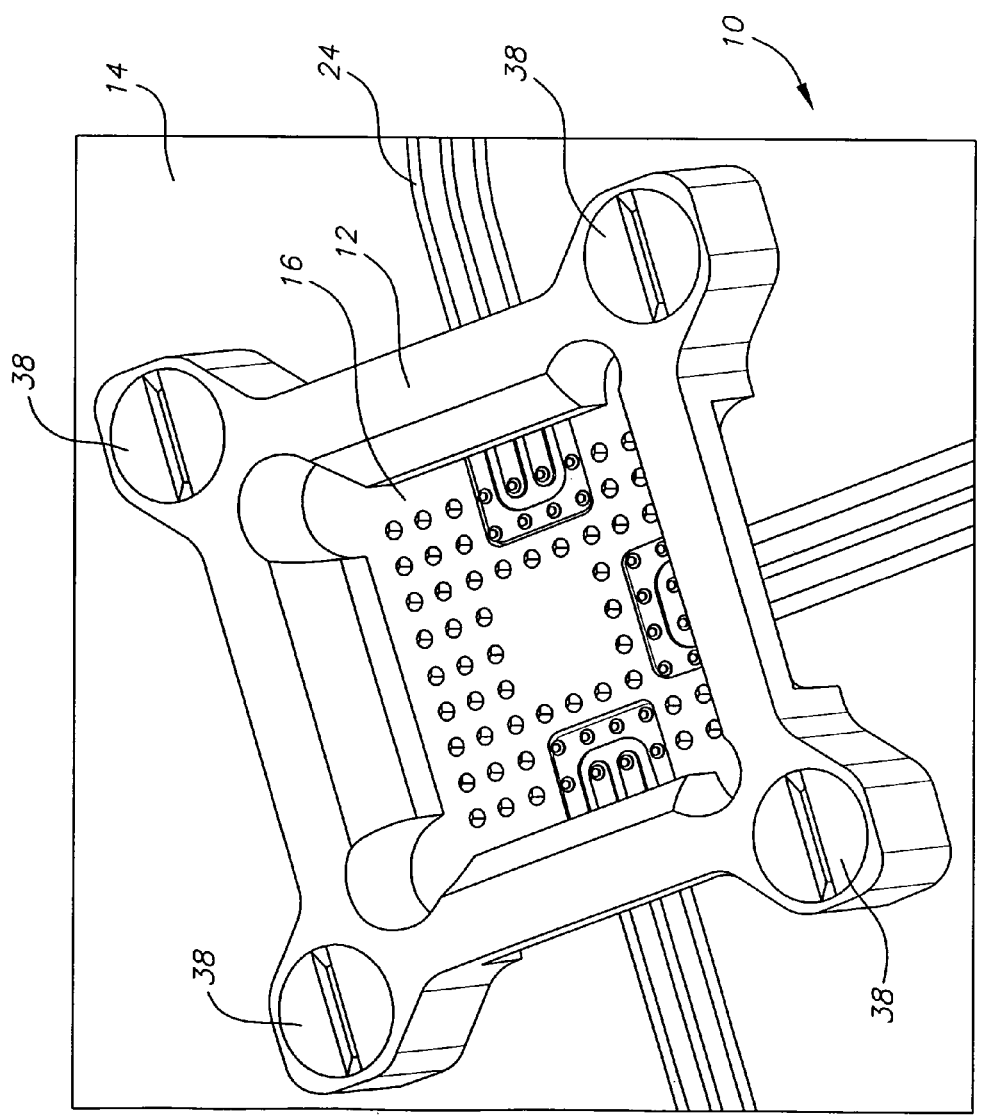
FIG. 1 is a perspective view of the test contactor of the present invention.
Figure 2:
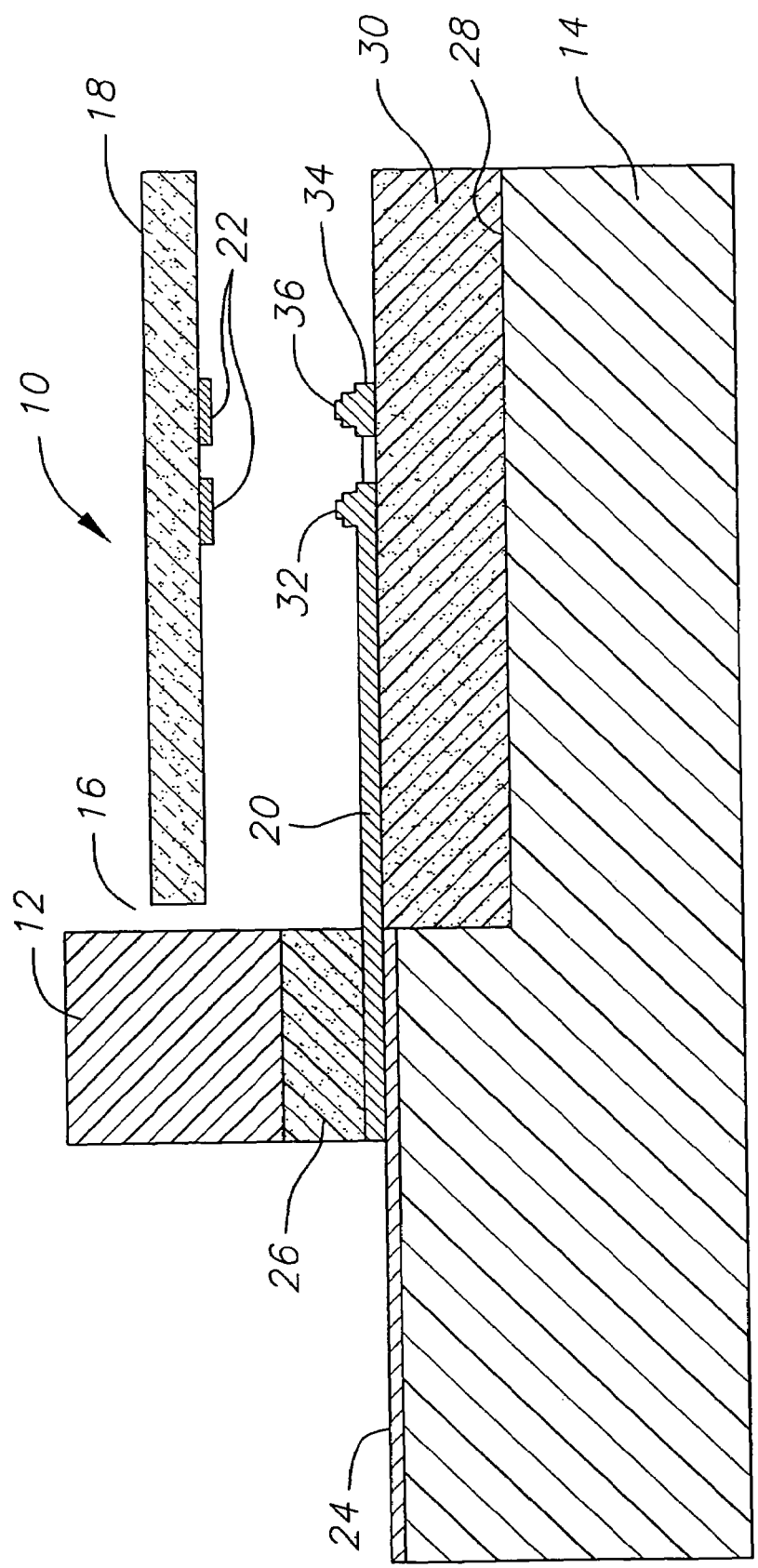
FIG. 2 is a partial cross-sectional detailed view of the test contactor of FIG. 1.

FIG. 1 illustrates an integrated circuit test interface system 10 of the present invention. As also can be seen in FIG. 2, the interface system includes an alignment housing 12 positioned on a laminated printed circuit board 14. Alignment housing 12 forms a cavity 16 for placement and alignment of the integrated circuit or semiconductor package 18 to be tested. The semiconductor package will also be referred to herein as the "unit under test". The alignment housing 12 aligns the unit under test to conductive flexible contact fingers 20 integrated into the printed circuit board 14. The interface system is constructed such that the geometry of the flexible contact fingers form an electrically balanced microwave transmission line structure from the printed circuit board periphery beyond an outer perimeter of the integrated circuit or unit under test to the test pads 22 located on the unit under test. The transmission line structure is based on a coplanar waveguide geometry (CPW) that is compressed onto a trace or pad 24 positioned on the printed circuit board 14. The line structure is compressed onto the trace by a non-conductive tie-bar 26 positioned between housing 12 and contact finger 20. The tie-bar is compressed to the printed circuit board with the alignment housing 12. Contact finger 20 extends over a shallow depression 28 formed in the printed circuit board. The depression is filled with a non-conductive elastomer 30 which serves as a force compression mechanism and a dielectric medium for the CPW transmission line. The contact finger forming the CPW transmission line terminates in a contact section 32 and aligns with test pads 22 for the unit under test. The contact section 32 is raised or elevated and is designed to engage the test pad location on the integrated circuit.

Figure 4:
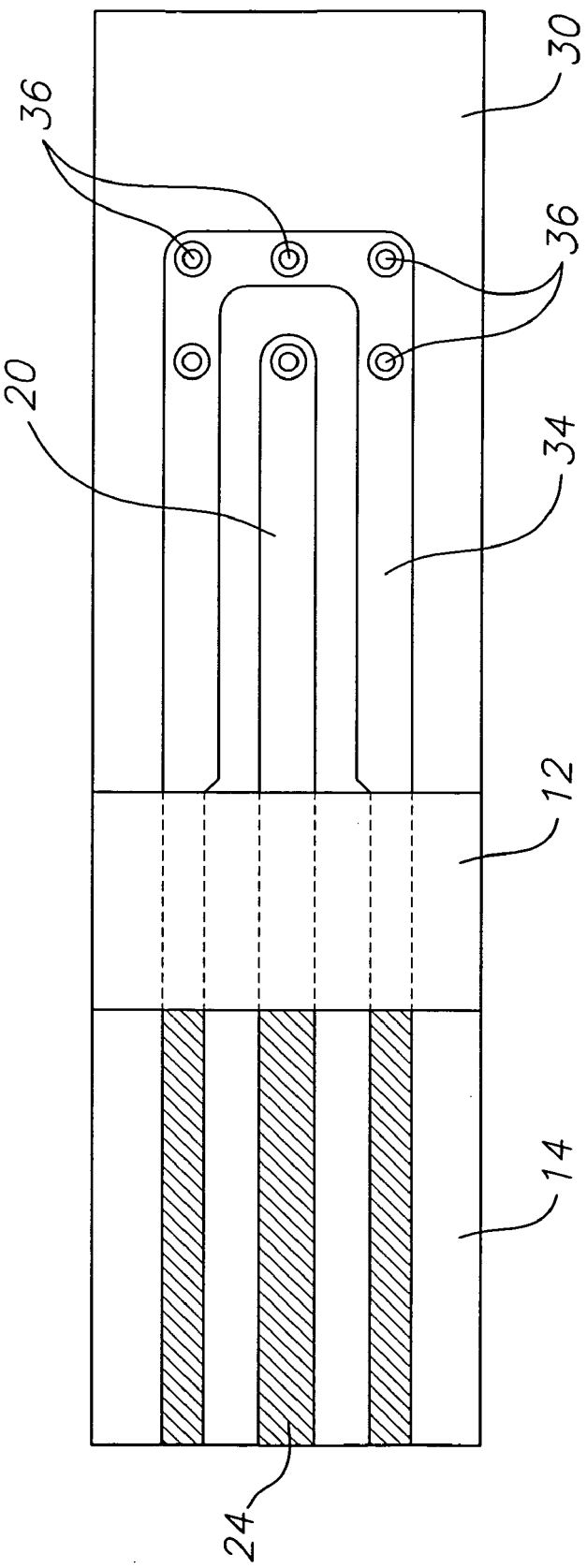
FIG. 4 is a top detailed view of a single contact finger with a U-shaped ground beam.
Figure 5:
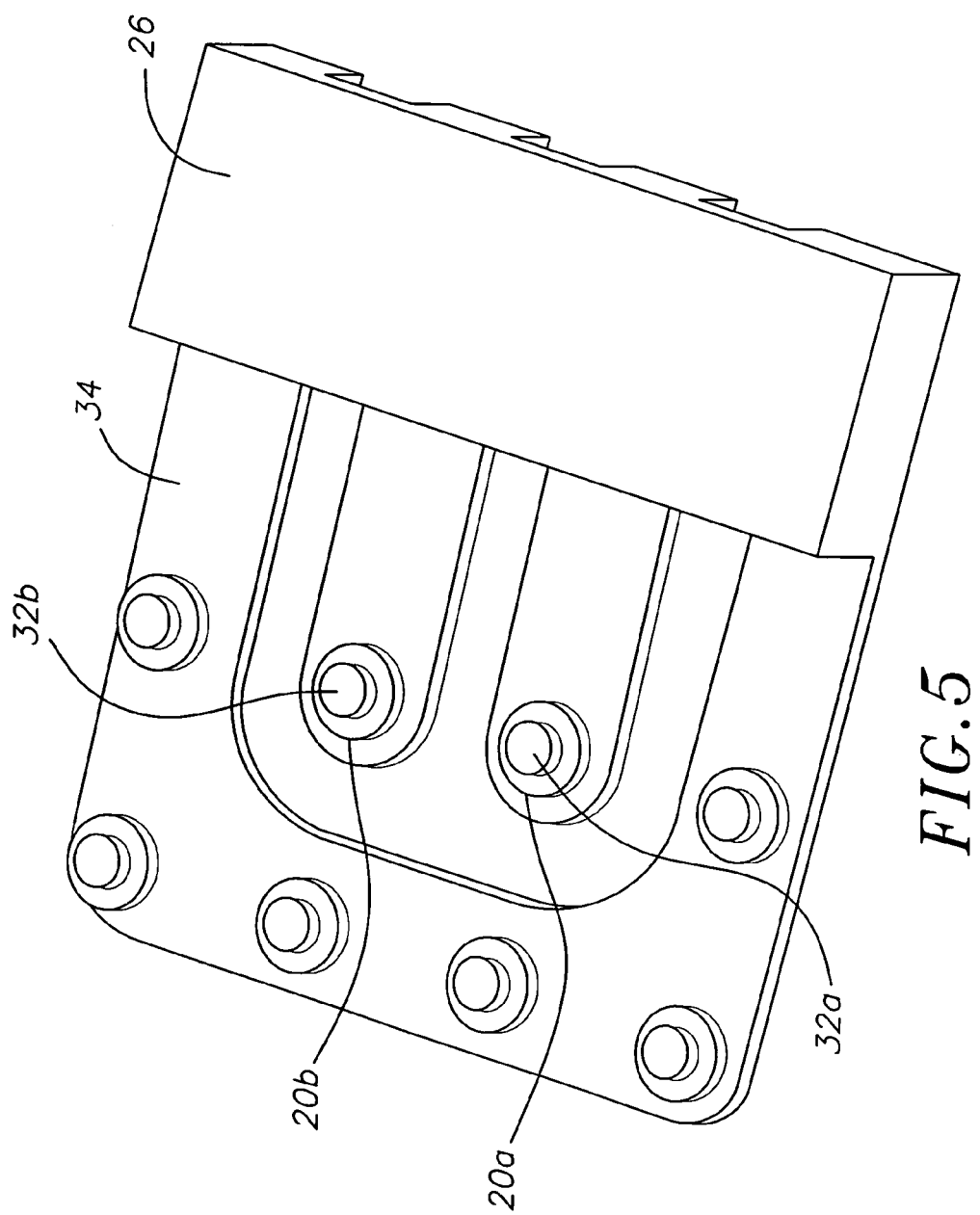
FIG. 5 is a perspective detailed view of a contact finger having two signal lines and a U-shaped ground beam; and, FIG. 6 is a perspective detailed view of a contact finger being Kelvin leads.

As also can be seen in FIG. 4, a U-shaped flexible ground finger 34 is positioned around flexible finger 20. Ground finger 34 includes a plurality of raised contact sections 36. Contact sections 36 also are aligned to make contact with separate test pad locations 22 on the unit under test. A single contact finger 20 as shown in FIG. 4 is for example used in applications requiring a single controlled impedance line, however other applications are possible such as shown in FIG. 5 where there are two contact fingers 20a and 20b which for example are used in applications requiring a balanced differential signal line. Whether there is a signal control impedance line, or a balanced differential signal line, the U-shaped ground finger 34 is utilized. Flexible fingers 20a and 20b each have raised contact portions 32a and 32b.

The contactor of the interface system 10 as shown in FIG. 1 includes three differential lead frame units wherein the housing covers the lead frame units. The contactor combines the impedance control structures integrated with conventional spring pin contacts for power, ground and low speed signal I/O's. All of the assembly materials for the interface system have been taken into account to match the proper impedance of the system, and in material transition zones, the transmission line has been compensated for optimum signal integrity.

Figure 3:
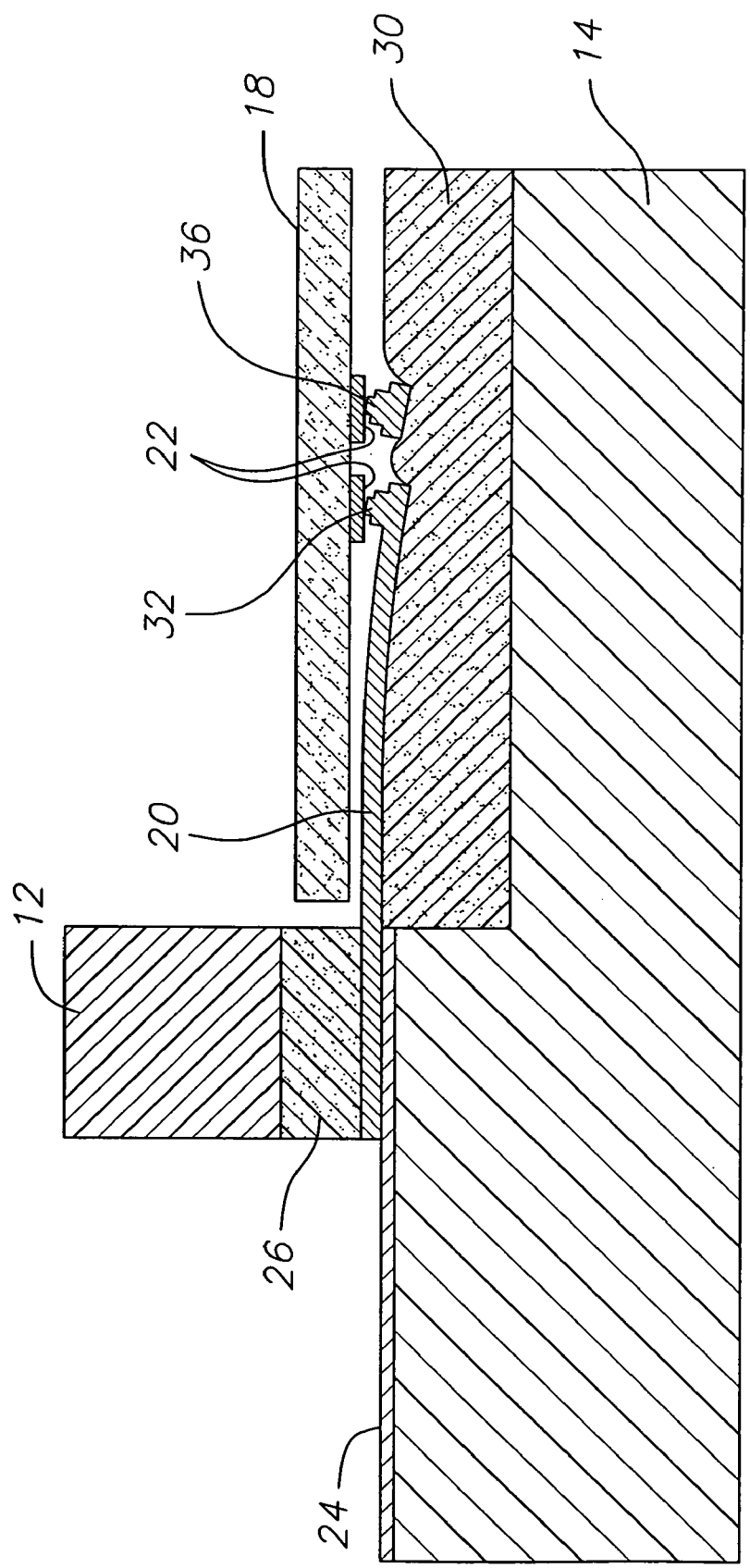
FIG. 3 is a partial cross-sectional view of the test contactor of FIG. 2 illustrating a contactor in use.

In use the integrated circuit or unit under test is inserted into the cavity 16 in the housing 12 and aligned laterally into position. The unit under test is then pressed into the elevated contact locations 32 and 36 on the contact finger 20 and ground finger 34 as shown in FIG. 3. The contact finger and ground finger is then driven down into the non-conductive elastomer located in the depression on the printed circuit board. The compression of the elastomer results in an adequate force to ensure good electrical contact between the contact portions and the test pad locations on the integrated circuit.

The entire test interface system is designed and fabricated as a balanced, high speed, microwave transmission line. The interface system utilizes CPW transmission line structures, or flexible fingers, that radiate inward from mounting contact pads on the printed circuit board over a non-conductive elastomer contained in the shallow depression on the printed circuit board. The CPW transmission line structures, are bonded to the non-conductive tie-bar that aligns the alignment housing, and provides compliance for the contacts to compress onto the printed circuit board pads. The housing 12 is attached to the printed circuit board 14 with screws 38, thus providing the clamping force required for interconnection to the printed circuit board.

The transmission line structure can be designed such that it is a controlled impedance path to a specified value, for example, 50 ohms, coplanar waveguide, slot-line or other transmission line profiles could be achieved as required by the unit under test being tested. The transmission line structures can be composed of two or more layers, thus allowing for higher signal density, or allowing for multilayer impedance controlling structures, such as a microstrip. The transmission line structures can be designed such that there is a balanced differential pair to a specified value, such as 100 ohms differential, or designed such that there is no impedance control, for design simplicity, where high speed is not required. The transmission line structures can be designed such that the lines are of maximum cross-sectional area, for applications of high current carrying capacity. The transmission line structures can also be designed and fabricated for peripherally leaded integrated circuits such as QFP, MLF/QFN, or XSOP integrated circuits.

Figure 6:
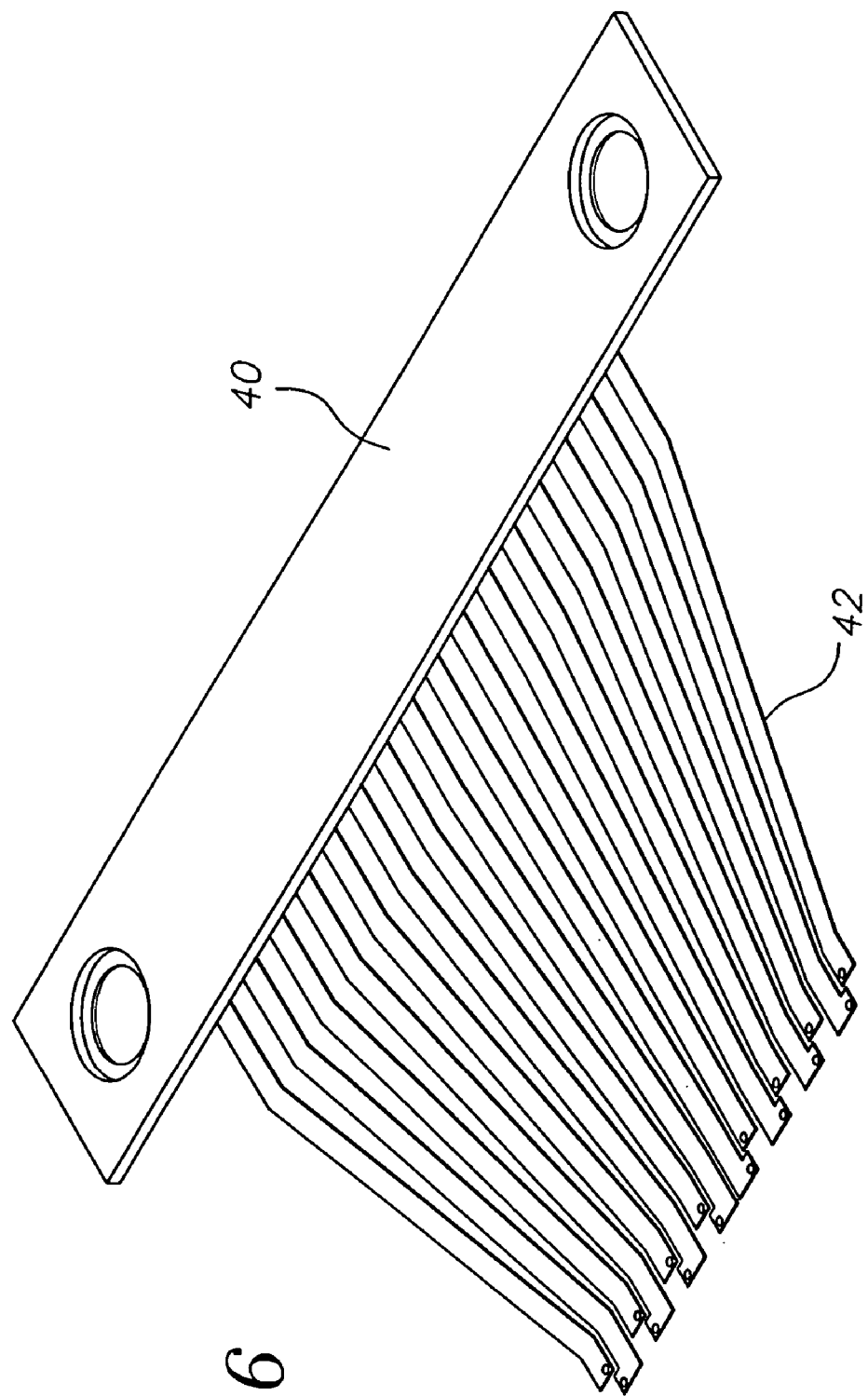

The transmission line structures, or flexible fingers, can be constructed not only for transmission line signals, but can be made in pairs of lines so that Kelvin testing of the integrated circuit can be done. FIG. 6 illustrates a contact finger 40 having Kelvin leads 42. Kelvin testing requires two independent circuit paths to each integrated circuit test pad location. The flexible fingers can be designed and fabricated for contacting test site locations such as area array pads or area array balls, LGA and BGA respectively. The IC test interface system 10 of the present invention can be constructed such that non-essential device interconnect signals, such as power, digital ground, low speed I/O, can be transmitted through conventional pogo pin or other contact technology built into the shallow depression area of the printed circuit board. The conductive elements of the interface system of the present invention can be fabricated with an integrated layer of copper for high power integrated circuits such that a higher amount of current can be carried to the test site locations.

It is to be understood that the above description of the present invention is intended to be illustrative, and not restrictive. Many other embodiments will be apparent to those of skill in the art upon reviewing the above description. The scope of the invention should, therefor, be determined with reference to the appended claims, along with the full scope of equivalents to which such claims are entitled.

What is claimed is:

1. A test interface system for an integrated circuit comprising:
    an alignment housing positioned on a printed circuit board, the alignment housing having a cavity for receipt and positioning of the integrated circuit to be tested;
    the printed circuit board having a non-conductive elastomer portion positioned in a depression along a surface of the printed circuit board; and,
    an electrically balanced microwave transmission line structure integrated into the printed circuit board having means for transmitting test signals from the integrated circuit and along the printed circuit board to external test electronics;
    wherein the means for transmitting test signals includes a flexible finger having a raised contact portion held in contact with the integrated circuit through compression of the non-conductive elastomer portion on the printed circuit board.

2. The test interface system of claim 1 further comprising a U-shaped ground contact adjacent the transmission line structure.

3. The test interface system of claim 1 wherein the flexible finger is for controlled impedance testing.

4. The test interface system of claim 1 wherein there are two flexible fingers for balanced differential signal testing.

5. The test interface system of claim 1 wherein the flexible finger is a Kelvin lead.

6. The test interface system of claim 1 wherein the flexible finger is held to the printed circuit board by a non-conductive tie-bar positioned between the housing and the flexible finger.

7. The test interface system of claim 1 wherein there are a plurality of electrically balanced microwave transmission lines positioned around the cavity of the housing.

* * * * *